United States Patent
Preble et al.

(10) Patent No.: US 10,236,659 B2
(45) Date of Patent: Mar. 19, 2019

(54) MODE-LOCKED LASERS ON SILICON BY PALLADIUM BONDING AND METHODS THEREFOR

(71) Applicants: Stefan F. Preble, Pittsford, NY (US); Zihao Wang, Rochester, NY (US); Michael L. Fanto, Rome, NY (US)

(72) Inventors: Stefan F. Preble, Pittsford, NY (US); Zihao Wang, Rochester, NY (US); Michael L. Fanto, Rome, NY (US)

(73) Assignee: Rochester Institute of Technology, Rochester, NY (US)

( * ) Notice: Subject to any disclaimer, the term of this patent is extended or adjusted under 35 U.S.C. 154(b) by 0 days.

(21) Appl. No.: 15/944,915

(22) Filed: Apr. 4, 2018

(65) Prior Publication Data

US 2018/0287332 A1    Oct. 4, 2018

Related U.S. Application Data

(60) Provisional application No. 62/481,405, filed on Apr. 4, 2017.

(51) Int. Cl.
| | |
|---|---|
| *G02B 6/12* | (2006.01) |
| *H01S 5/02* | (2006.01) |
| *H01S 5/065* | (2006.01) |
| *H01S 5/343* | (2006.01) |
| *H01S 5/34* | (2006.01) |

(Continued)

(52) U.S. Cl.
CPC .............. *H01S 5/0216* (2013.01); *G02B 6/13* (2013.01); *H01S 5/021* (2013.01); *H01S 5/0217* (2013.01); *H01S 5/0428* (2013.01); *H01S 5/0657* (2013.01); *H01S 5/3412* (2013.01); *H01S 5/34313* (2013.01); *G02B 2006/12061* (2013.01); *G02B 2006/12121* (2013.01); *G02B 2006/12123* (2013.01); *G02B 2006/12164* (2013.01); *H01S 5/0425* (2013.01); *H01S 2301/176* (2013.01)

(58) Field of Classification Search
CPC ....... H01L 2924/00014; H01L 2924/00; H01L 2224/16225; G02B 6/12; G02B 6/4214
See application file for complete search history.

(56) References Cited

U.S. PATENT DOCUMENTS

| | | | |
|---|---|---|---|
| 7,133,426 B2 | 11/2006 | Jacinavicius et al. | |
| 7,563,661 B2 * | 7/2009 | Tanaka | B23K 26/0613 257/E21.561 |
| 7,968,863 B2 | 6/2011 | Lelarge et al. | |

(Continued)

FOREIGN PATENT DOCUMENTS

| | | |
|---|---|---|
| EP | 2958253 | 12/2015 |
| WO | 2012072414 | 6/2012 |

OTHER PUBLICATIONS

Tanabe et al. "Electrically pumped 1.3 um room-temperature InAs/GaAs quantum dot lasers on Si substrates by metal-mediated wafer bonding and layer transfer" Optics Express, May 10, 2010 vol. 18 No. 10. Optical Society of America.

(Continued)

*Primary Examiner* — Jennifer Doan
(74) *Attorney, Agent, or Firm* — Bond, Schoeneck & King, PLLC; Joseph Noto

(57) ABSTRACT

A mode-locked laser on a silicon substrate and method for the production thereof by low temperature palladium bonding is disclosed.

10 Claims, 23 Drawing Sheets

(51) Int. Cl.
*G02B 6/13* (2006.01)
*H01S 5/042* (2006.01)

(56) References Cited

U.S. PATENT DOCUMENTS

| | | | |
|---|---|---|---|
| 7,991,023 B2 | 8/2011 | Liu et al. | |
| 8,411,711 B2 | 4/2013 | Gubenko et al. | |
| 8,664,642 B1 * | 3/2014 | Davis | H01L 29/41 257/29 |
| 9,831,635 B2 | 11/2017 | Zhang et al. | |
| 2006/0227825 A1 | 10/2006 | Kovsh et al. | |

OTHER PUBLICATIONS

Tanabe et al. "III-V/Si hybrid photonic devices by direct fusion bonding". Scientific Reports, 2012. pp. 1-6.

Liu et al. "High performance continuous wave 1.3 m quantum dot lasers on silicon". Applied Physics Letters, 2014. pp. 041104-1-041104-4.

"1.3 Im InAs/GaAs quantum dot lasers on Si substrates by low resistivity Au-free metal-mediated wafer bonding" Journal of Applied Physics, 2012.

"Fabrication of electrically pumped InAs/GaAs quantum dot lasers on Si substrates by Au-mediated wafer bonding" Physica status Solidi, 2011. pp. 319-321.

"Electrically pumped continuous-wave 1.3 μm quantum-dot lasers epitaxially grown on-axis (001) GaP/Si". Optics Letters, 2017. pp. 338-341. 42.2.

Lui et al. "Long-wavelength InAs/GaAs quantum-dot laser diode monolithically grown on Ge substrate". Nature Photonics, 2011. pp. 416-419.

"A hybrid silicon evanescent quantum dot laser" Applied Physics Express, 2016.

Kurczveil et al. "Robust hybrid quantum dot laser for integrated silicon photonics". Optics Express, 2016. pp. 16167-16174. vol. 24, No. 14.

Fang et al. "A racetrack mode-locked silicon evanescent laser". Optics Express, 2008. vol. 16, No. 2. pp. 1393-1398.

Koch et al. "Mode-locked silicon evanescent lasers". Optics Express, 2007.

\* cited by examiner

MODE-LOCKED LASERS ON SILICON BY PALLADIUM BONDING AND METHODS THEREFOR

CROSS REFERENCE

This application claims the benefit of the filing date of U.S. Provisional Patent Application Ser. No. 62/481,405, filed Apr. 4, 2017, which is hereby incorporated by reference in its entirety.

This invention was made with government support under grant number ECCS-1309230 awarded by the National Science Foundation. The government has certain rights in this invention.

FIELD

This invention relates to MLLs on silicon substrate by palladium bonding, which have ultrafast, high repetition rate, low-jitter, and temperature insensitive properties.

BACKGROUND

Silicon photonics is one of the most promising solutions to achieve low cost CMOS-compatible optical integrated circuits (OICs) and nearly all the components of silicon photonics interconnections have been individually demonstrated. However, a proper way to monolithically integrate the robust and low-powered lasers into silicon photonics platform is still under investigation. Specifically, current approaches are highly inefficient and not robust against temperature variations (requires T<40-80° C. for operation).

Mode-locked lasers have the ability to generate ultrashort pulses from femtosecond to sub picosecond which can be used for optical clock signal generation, OTDM, WDM, high speed electro-optic sampling systems and so on. In addition to using the bulky Ti:sapphire laser or other vibronic laser to generate pulses light, semiconductor mode-locked lasers (MLLs) have been demonstrated in near infra-red and hybrid quantum well MLLs has recently been demonstrated, which provide opportunities for photonic integrations.

InAs quantum dot (QD) lasers are attractive candidates for photonic integration due to their capability for high temperature operation. Recently, InAs QD lasers were monolithically grown on silicon substrates. These novel direct growth technologies need to apply either 4-6° off-cut or pre-patterned silicon substrates first and then grow thick buffer layers to eliminate the threading dislocations (TDs) between Si and GaAs, both of which limit CMOS compatibility. Up to date, ultrafast, high repetition rate, low-jitter, temperature insensitive quantum dot mode-locked lasers (QD-MLLs) have been successfully proved. Currently, only quantum well mode-locked lasers (QW-MLLs) have been demonstrated on silicon by evanescent coupling method which may have low efficiency and thermal issues for photonics integration.

SUMMARY

In accordance with one aspect of the present disclosure, there is provided a method for fabricating a mode-locked laser on a silicon substrate including coating a palladium bonding layer on a silicon substrate; bonding a mode-locked laser including an etch stop layer and compound semiconductor substrate to the palladium layer by a low temperature metal-mediated bonding technique; removing the compound semiconductor substrate; removing the etch stop layer; and fabricating the mode-locked laser.

In accordance with another aspect of the present disclosure, there is provided a mode-locked laser on a silicon substrate including a mode-locked laser bonded to a palladium bonding layer and a silicon substrate bonded to the palladium bonding layer.

These and other aspects of the present disclosure will become apparent upon a review of the following detailed description and the claims appended thereto. Reference is now made in greater detail to an embodiment of the invention, an example of which is illustrated in the accompanying drawings. Wherever possible, the same reference numerals are used throughout the drawings and the description to refer to the same or like parts. Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

DETAILED DESCRIPTION

In an embodiment, the invention relates to a MLL palladium bonded to a silicon substrate and methods for fabrication thereof. An embodiment includes hybrid InAs QD MLLs on silicon substrate, which have ultrafast, high repetition rate, low-jitter, temperature insensitive properties and promising to integrating laser source together with silicon photonic OTDM and WDM optical integrate circuits (OICs) on silicon.

Figure 1:
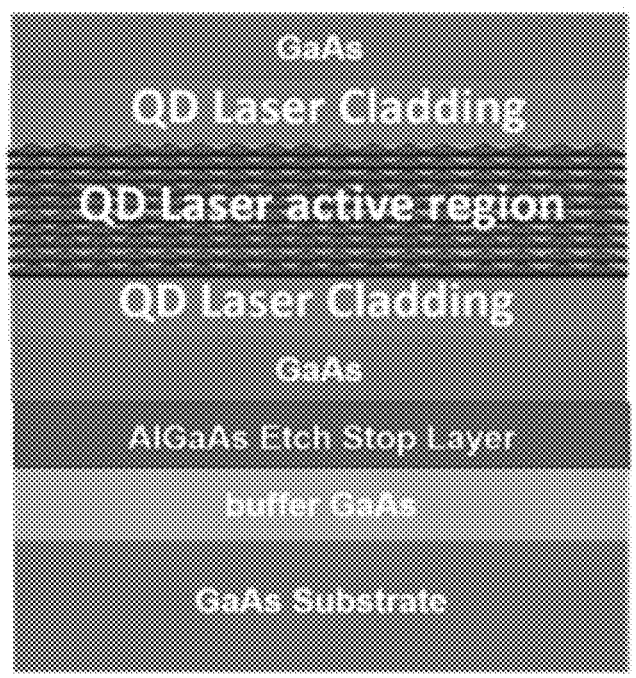
FIG. 1 is a schematic showing a process step illustrating MBE growth of a QD laser structure on a GaAs substrate.

FIG. 1 shows a fabrication method for making a mode-locked quantum dot laser epitaxial structure using low temperature metal wafer bonding laser diode on silicon in accordance with an embodiment of the invention. As illustrated, the laser includes a compound semiconductor substrate (GaAs), an etching stop layer (AlGaAs), a lower GaAs contact layer, a lower optical cladding layer, a quantum dot active region, a upper optical cladding layer and a upper contact GaAs layer. The compound semiconductor substrate may be a Gallium Arsenide (GaAs) substrate or Indium Phosphide (InP) substrate. The etching stop layer may be AlAs or aluminum rich AlGaAs (as shown). The lower contact layer and upper contact layer may be a highly doped GaAs. The lower optical cladding layer and upper optical cladding layer employ AlGaAs.

In the embodiment of quantum dot laser, the compound semiconductor substrate is GaAs, the etching stop layer is AlGaAs and the quantum dot active region are ten staked InAs quantum dot layers.

Figure 2:
FIG. 2 is a schematic showing a process step illustrating a palladium layer deposited on a Si substrate.

In FIG. 2, the palladium layer is coated on Si substrate by E-beam evaporation (or sputtering). The thickness of Pd layer can be varied from 200 nm or any thickness above.

Figure 3:
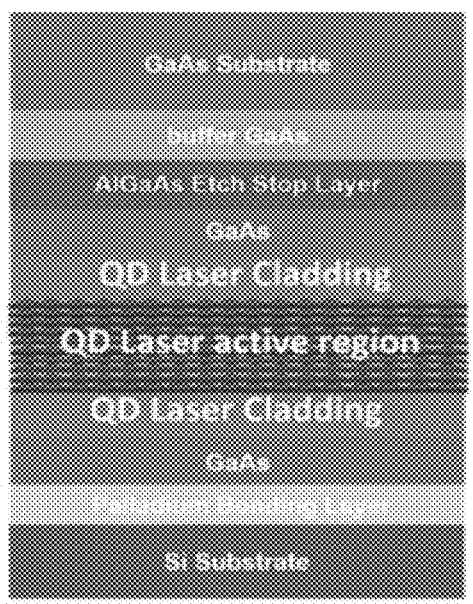
FIG. 3 is a schematic showing a process step illustrating low temperature wafer bond GaAs epitaxy structure to the silicon substrate.

FIG. 3 illustrates the quantum dot laser structure bonded on the silicon substrate by low temperature metal wafer bonding technology. The laser structure which is shown in FIG. 1 is bonded to the silicon substrate by a thin Pd layer at low temperature (room temperature to 250° C.). Then the GaAs substrate of bonded laser structure is removed by chemical etchant and stopped at AlGaAs layer.

Figure 4:
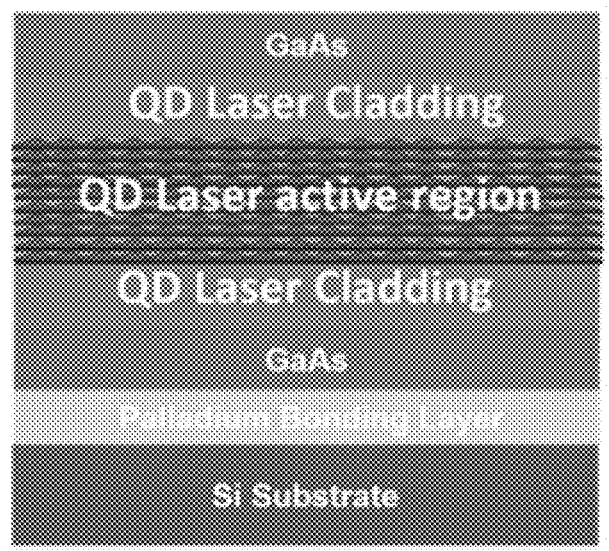
FIG. 4 is a schematic showing a process step illustrating removal of the GaAs layer and AlGaAs etch stop layer.

The AlGaAs layer is etched away by, e.g., Hydrofluoric Acid (HF) as shown in FIG. 4.

Figure 5:
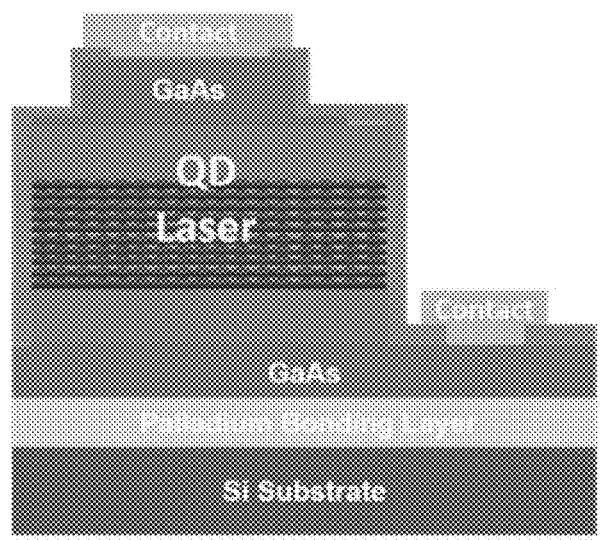
FIG. 5, is a schematic showing a process step illustrating fabricated mode locked QD laser on the silicon substrate.

FIG. 5, illustrates the mode locked laser fabricated by photolithography, etching and metal deposition.

After epitaxial growth, the QD laser heterostructure is bonded to a silicon substrate by the Pd-mediated bonding process. In this process Pd, e.g., with a thickness of ~200 nm, is deposited on a Si substrate by, e.g., e-beam evaporation. The III-V laser wafer is then put in contact with the Pd coated Silicon wafer and permanently bonded, for example, at a low temperature and time of 250° C. and 1.5 hours, respectively, at 1000 mbar pressure which is at least 50° C. and 50% less than previously described metal-mediated bonding techniques. After bonding, the GaAs substrate is removed, for example, by a combination of mechanical polishing and wet chemical etching, where the AlGaAs in the heterostructure acts as an etch stop layer. After removing the AlGaAs (e.g., Hydrofluoric Acid for 30 seconds), the ridge waveguide lasers are fabricated by standard photolithography, etching and metal deposition process.

Figure 6A:
FIG. 6A is a schematic and FIG. 6B is a diagram of the InAs QD mode-locked laser diode on silicon by Pd—GaAs wafer bonding of Example 1.

An embodiment of a hybrid QD-MLL heterostructure is shown in FIG. 6A. The active region was grown by molecular beam epitaxy (MBE) on an n-type GaAs (100 nm) substrate, containing 10 stacks of self-assembled InAs QD layers. In this laser heterostructure, the p-type and n-type doped $Al_{0.35}Ga_{0.65}As$ claddings are designed to confine the QD emission in the III-V waveguide. A 200 nm $Al_{0.7}GaAs$ etch stop layer is designed between the laser structure and GaAs buffer layer for epitaxy membrane transfer. Low temperature Pd—GaAs wafer bonding technology was used to fabricate QD-MLLs. This p-side down low temperature wafer bonding technology shows the potential to enhance heat dissipation properties which might lower the threshold current of bonded lasers compared to unbonded lasers.

Figure 6B:
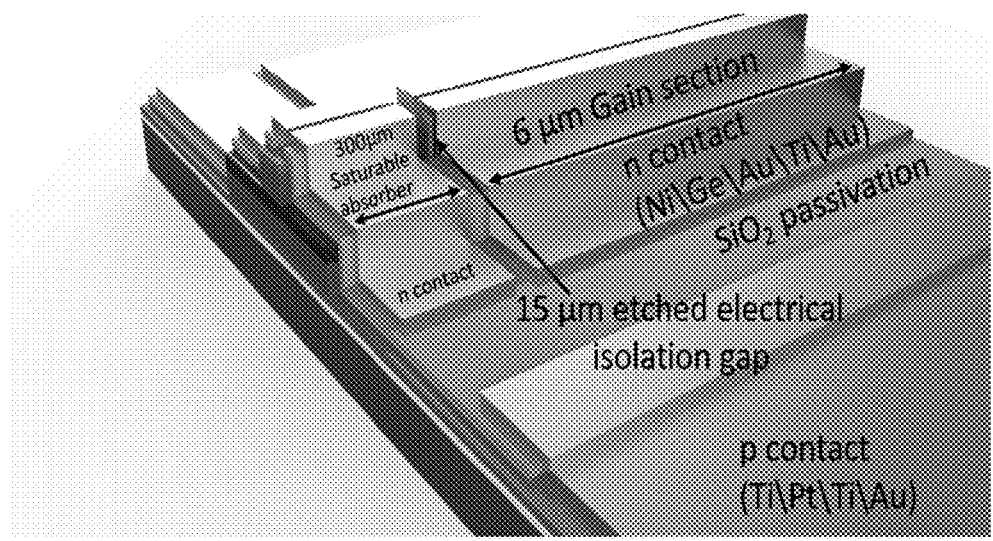

The schematic of passive QD-MLLs is shown in FIG. 6B, each MLL has a long gain section and a short saturable absorber section which are separated by a electric isolation gap. Electric isolation gaps are created together with laser ridges by dry etching. This electrical isolation gap also could be created by using proton implantation. FIG. 6B is an embodiment of an InAs QD mode-locked laser on Si by Pd—GaAs wafer bonding. The MLL shown has a 6 mm long gain section and a 300 μm short saturable absorber section which are separated by a 15 μm wide electric isolation gap. The QD-MLLs are fabricated by standard process where the waveguide and mesa width are 5 μm and 25 μm, respectively.

The low temperature Pd—GaAs wafer bonding technology enables QD-MLLs to integrate with silicon photonic optical integrated circuits (OICs), such as optical time division multiplexing (OTDM), wavelength division multiplexing (WDM) and optical code division multiple access (OCDMA).

Super computers working in optical domain might be realized in the future.

This invention achieves for the first time quantum dot mode-locked lasers on silicon by Pd—GaAs wafer bonding technology operating at 1.3 μm. The optimum mode locked condition is investigated by varying gain injection currents as well as reverse bias voltages of saturable absorber so that a Fourier-transform-limited pulse has been achieved.

The invention solves the following problems: temperature insensitivity, ultra-short time, high repetition rate, low-jitter, mode-locked laser source on silicon substrate and can be used for on-chip photonic integration circuits.

The bonding metal palladium is ohmic to both GaAs and Si substrate which leads the bottom contacts could be done either on top or bottom of the wafers. It gives flexibility to the fabrication.

The bonding process is done at low temperature (250° C.) which has negligible effects on III\V material during the fabrication.

QD MLLs on silicon substrate have been experimentally demonstrated operating at 1.3 μm with a repetition rate and pulse width of ~7 GHz and 3 ps, respectively. In addition, the optimum mode locked condition is investigated by varying gain injection currents as well as reverse bias voltages of saturable absorber so that a Fourier-transform-limited pulse has been achieved.

Figure 11A:
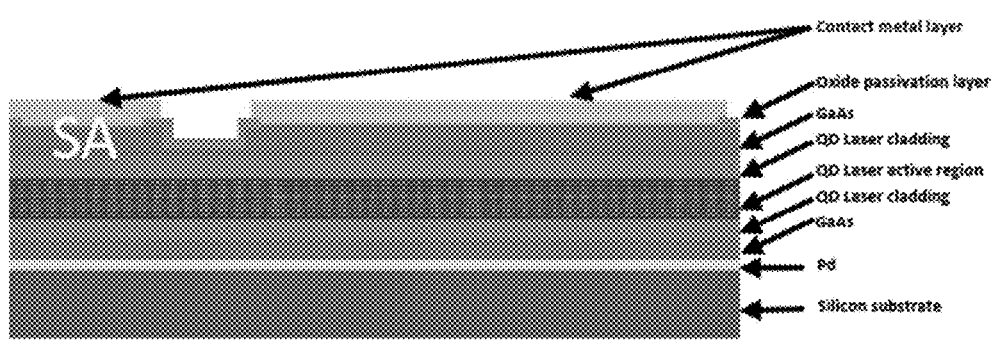
FIG. 11A is a schematic drawing of an embodiment of a passive mode-locked (MLL) QD laser bonded on Si substrate with a saturable absorber (SA) in front of the laser cavity.
Figure 11B:
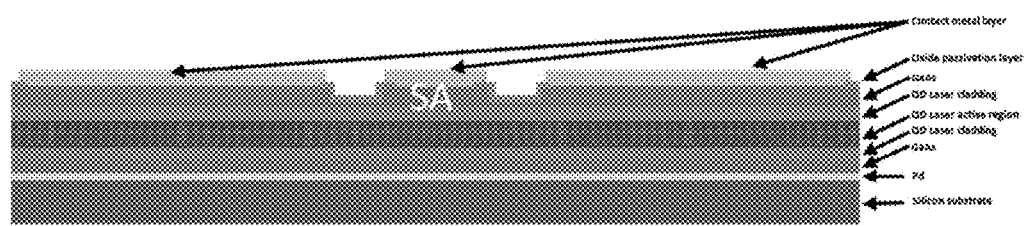
FIG. 11B is a schematic drawing of an embodiment of colliding pulse mode-locked (CPM) QD laser bonded on Si substrate with a saturable absorber (SA) in the middle of the laser cavity.
Figure 11C:
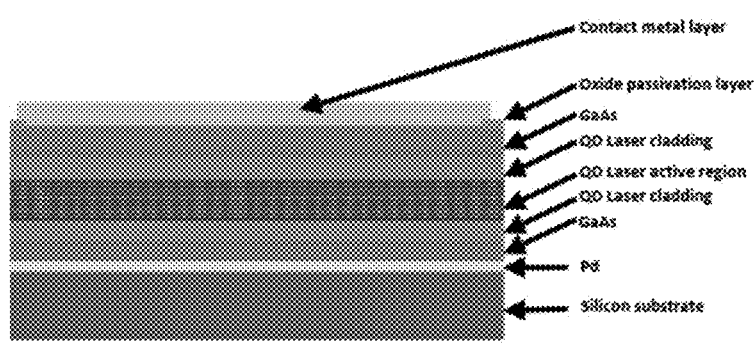
FIG. 11C is a schematic drawing of an embodiment of a single cavity made locked QD laser bonded on Si substrate.

The bonded QD mode locked laser is not limited by the passive QD MLL in the description which has a saturable absorber (SA) in front of laser cavity as shown in FIG. 11A. The QD MLLs can be also achieved under colliding pulse mode-locked (CPM) and single cavity mode locked configuration as shown in FIGS. 11B and 11C, respectively. Both CPM lasers and single cavity MLLs could also be achieved by using Pd—GaAs wafer bonding technology.

Figure 12A:
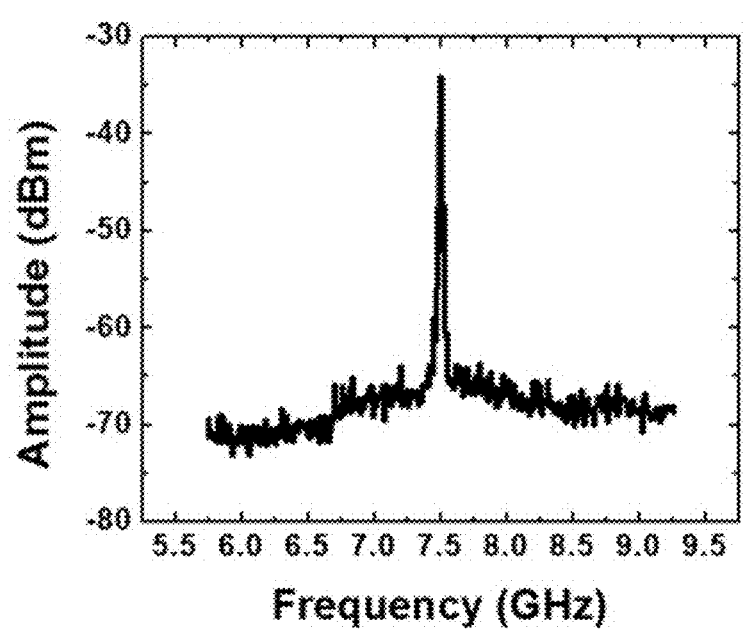
FIG. 12A is an embodiment of an RF spectrum of colliding pulse QD mode-locked laser and FIG. 12B is an embodiment of an RF spectrum of a single cavity mode locked laser bonded on Si.
Figure 12B:
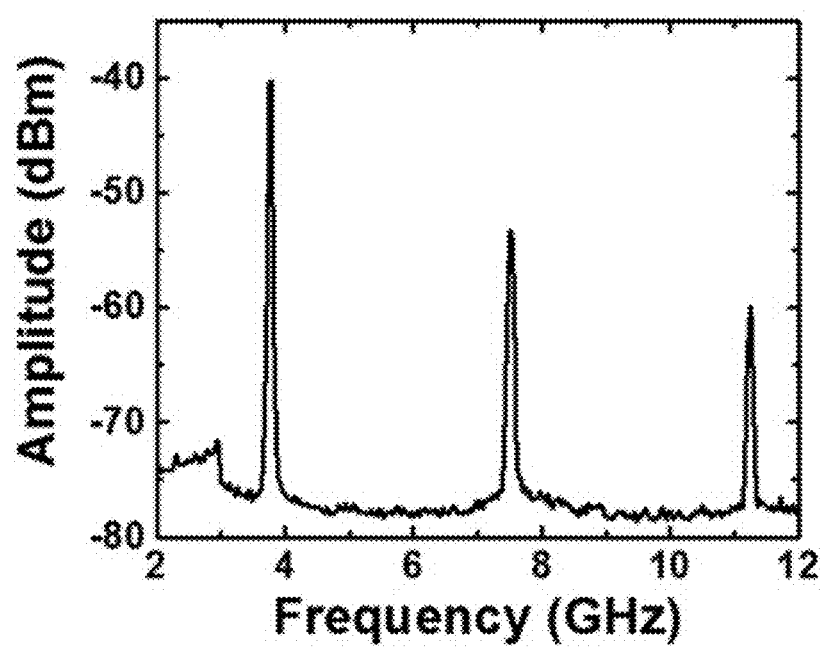

FIG. 12A is an embodiment of an RF spectrum of colliding pulse QD mode-locked laser and FIG. 12B is an embodiment of an RF spectrum of a single cavity mode locked laser bonded on Si.

Figure 13:
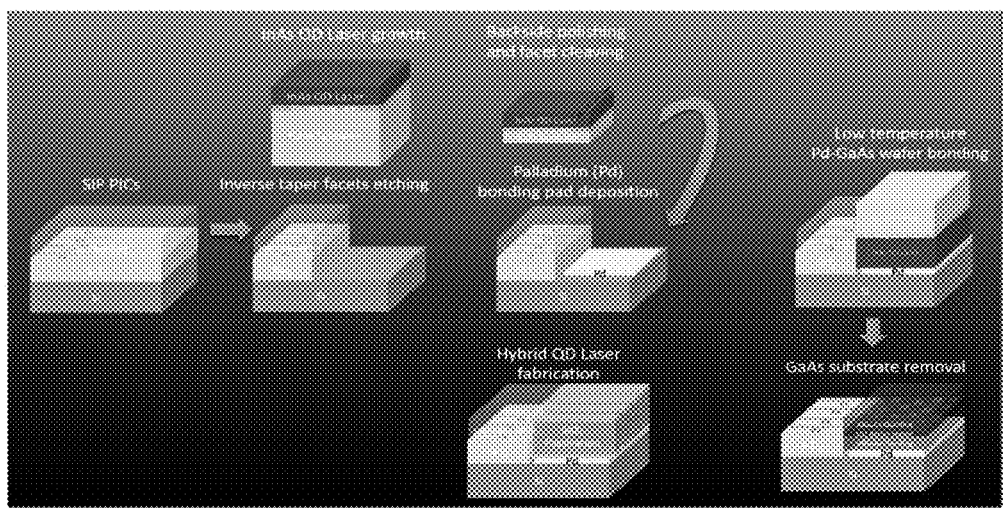
FIG. 13 is a schematic of an embodiment of process flow to bonded QD gain chip butt-joint coupled with silicon photonics integration circuits by using Pd—GaAs wafer bonding technology.

FIG. 13 illustrates an embodiment of an InAs MLL on Si by Pd—GaAs wafer bonding technology that is applied to heterogeneous integration of the QD lasers/gain chip with silicon photonics integrated circuits (PICs) by using a butt-joint coupling configuration. The details of process are described as follows: InAs quantum dots epitaxy wafer and silicon photonic integration circuits (PICs) SOI chip are individually prepared. The InAs QD laser epitaxy wafer is grown by MBE and then the wafer is mechanically polished. One side of laser facet is cleaved after that and prepared to flip-chip bonded to SiP PIC chip. The SiP PICs chip is made by standard process, such as e-beam lithography, dry etching and oxide cladding on a SOI wafer. After that, the silicon waveguides with spot size converters (SSCs) design will be etched down to silicon substrate. The etch thickness need to be well controlled to make sure the laser active region is well aligned with Si waveguide. The etched area is then coated with Pd film for low temperature wafer bonding between InAs laser epitaxy and SiP PIC chip, specifically, the cleaved facet side of laser chip could be precisely placed with a submicron gap from the SSCs by using state of the art flip-chip bonder. In order to leverage the feedback from the Silicon PICs, the cleaved laser facets could be coated with anti-reflection (AR) film. In the end, the GaAs substrate of InAs laser epitaxy is removed, and laser devices are made by standard laser fabrication.

The invention may be used in a commercial product, such as optical interconnects for telecommunications, photonic integration, 3D integrated circuits, and ultra-fast computation.

The disclosure will be further illustrated with reference to the following specific examples. It is understood that these examples are given by way of illustration and are not meant to limit the disclosure or the claims to follow.

Example 1

This example demonstrates an electrically pumped InAs quantum dot (QD) two-section passively mode-locked laser (MLL) on a silicon substrate by low temperature (250° C.) Pd—GaAs wafer bonding technology. The saturable absorber of the QD-MLL is electrically isolated by a 15-µm wide dry-etching gap which resulted in ~30 kΩ resistance from the gain regions of the MLL. At room temperature the laser operates in the O-band (1.3 µm) telecommunication wavelength regime with threshold current of 94 mA, laser bar cavity and absorber lengths of 6 mm and 300 µm, respectively. The optimum mode-locked conditions are observed under injection current and reverse bias voltage of 124 mA and −7 V, which generates pulses at a repetition rate of 7.3 GHz, an optical bandwidth of 0.97 nm, and a nearly transform limited pulse width of 2 ps ($sech^2$ pulse profile). These results enable QD-MLLs to be integrated with silicon photonic integrated circuits (PICs), such as optical time division multiplexing (OTDM) and optical clocks.

Recently we have demonstrated a metal wafer bonding platform using Palladium (Pd) to integrate InAs QD lasers on silicon substrates with a very low bonding temperature (<250° C.). This metal-mediated bonding process provides an ohmic contact to Silicon and excellent thermal conductivity, resulting in p-side down bonded lasers with enhanced performance over counterparts on native GaAs substrates. Here, we experimentally demonstrate a mode-locked QD laser on Si at a repetition rate of 7 GHz by using this Pd wafer bonding platform.

Mode-locked lasers generate ultrashort pulses for applications in optical clock generation, optical time division multiplexing (OTDM), wavelength division multiplexing (WDM), and high speed electro-optic sampling systems. In addition to using bulky Ti:sapphire lasers or other vibronic lasers to generate pulses of light, semiconductor mode-locked lasers (MLLs) and hybrid quantum well MLLs with pulsewidths from hundreds of femtoseconds to tens of picoseconds have been demonstrated in the near infrared, which provide opportunities for photonic integration. QD lasers are well suited for mode-locked applications due to their inhomogeneous gain spectrum and ultrafast carrier dynamics. Currently, ultrafast, high repetition rate, low-jitter, temperature insensitive quantum dot mode-locked lasers (QD-MLLs) have been realized. To further integrate QD-MLLs into an on-chip system, we have demonstrated an OTDM system using a QD-MLL which produces a 5 Gb/s clock signal externally coupled into a silicon photonics chip, generating a 40 Gb/s signal. In order to integrate the QDMLLs on chip, we have developed hybrid QD-MLLs on Si using the Pd—GaAs bonding technology. In this Example the growth design, fabrication, and characterization of the bonded QDMLLs will be discussed.

FIG. 6A is a heterostructure schematic and FIG. 6B is a diagram of the InAs QD mode-locked laser diode on silicon. The structure of the hybrid QD-MLL is shown in FIG. 6A. The active region was grown by molecular beam epitaxy (MBE) on an n-type GaAs (100) substrate, containing 10 stacks of self-assembled InAs QD layers (grown by Innolume GmbH, Dortmund, Germany). In this laser heterostructure, the p-type and n-type doped $Al_{0.35}Ga_{0.6}As$ claddings are designed to confine the QD emission in the III-V waveguide. A 200-nm $Al_{0.7}GaAs$ etch stop layer is grown between the laser structure and GaAs buffer layer for epitaxy membrane transfer. The low temperature Pd—GaAs wafer bonding technology used to fabricate QD-MLLs has been previously developed to make ridge waveguide Fabry-Perot lasers. Additionally, this p-side down low temperature wafer bonding technology shows the potential to enhance heat dissipation properties, which lower the threshold current of bonded lasers compared to unbonded ones. The schematic of the passive QDMLL is shown in FIG. 6B, where the MLL has a 6-mm long gain section and a 300-µm saturable absorber section separated by a 15-µm wide electric isolation gap.

Figure 7A:
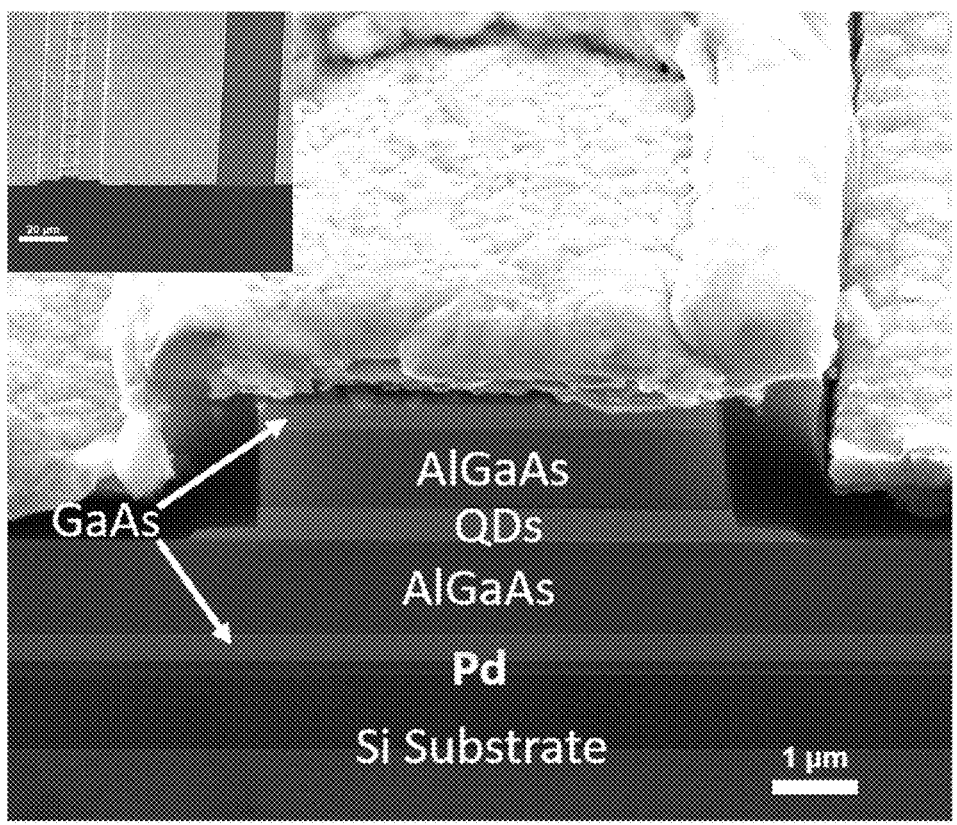
FIG. 7A is a magnified cross-section SEM image of the laser facet with a 70° tilted angle and inset is an unmagnified SEM image of the same region.
Figure 7B:
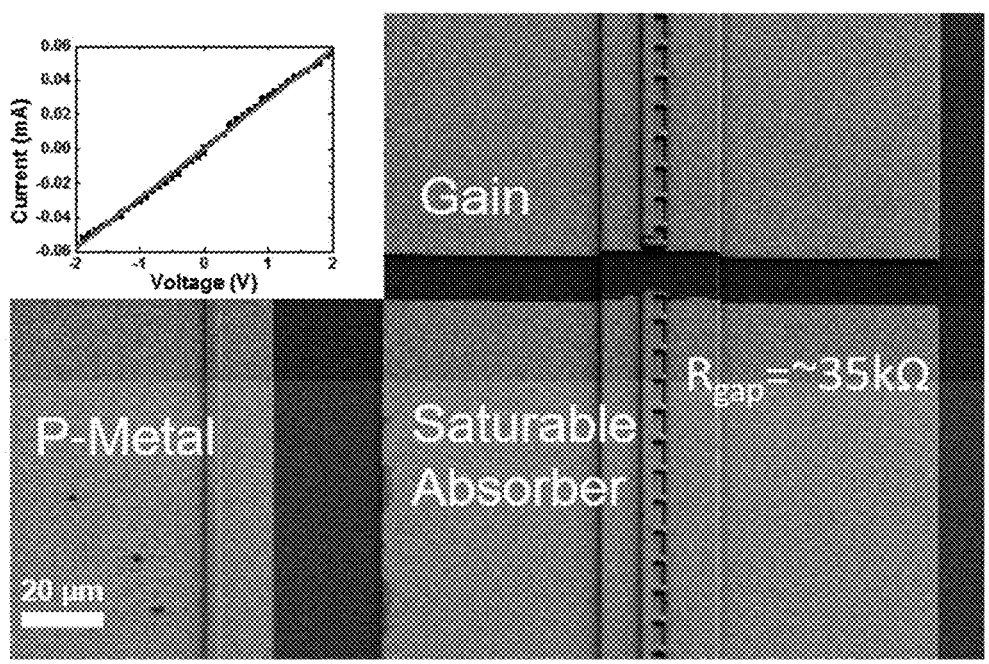
FIG. 7B is a top view SEM image and I-V characteristics of a 15 μm wide dry etched electrical isolation gap between the gain and saturable absorber sections according to Example 1.

FIG. 7A shows a magnified cross-section SEM image of the laser facet with a 70° tilted angle and (inset) unmagnified SEM image of the same region. FIG. 7B is a top view SEM image and I-V characteristics (inset) of a 15 µm wide dry etched electrical isolation gap between the gain and saturable absorber sections.

The QD-MLLs are fabricated with waveguide and mesa widths of 5 µm and 25 µm, respectively (FIG. 7A inset). Electric isolation gaps are made together with the laser ridges by dry etching to a depth of 2 µm (FIG. 7B). The resistance between the two laser sections is characterized by I-V measurements (FIG. 7B inset). The measured resistance is ~35 kΩ which allows the sections to be independently biased.

After fabricating the QD-MLLs on Si, the silicon substrate is mechanically polished to a thickness of ~100 μm before cleaving in order to realize a mirror facet that is free of striations (FIG. 7A). Although the facets could be high reflectivity (HR) coated, the facets were left as-cleaved for this Example.

Figure 8A:
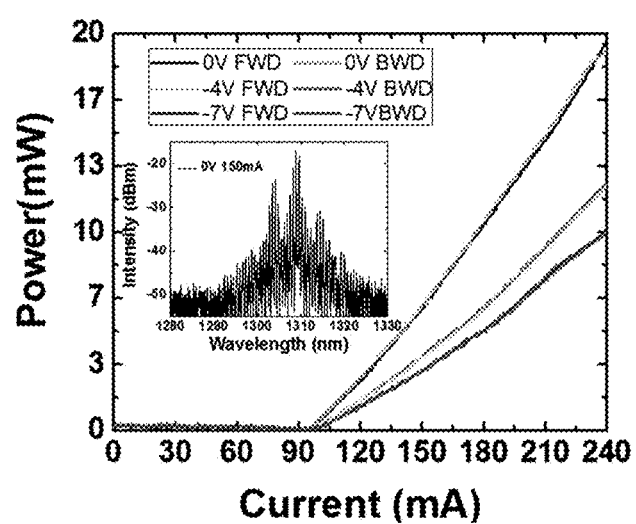
FIG. 8A illustrates light current (L-I) characteristics of the bonded mode-locked laser, the inset shows electroluminescence (EL) of bonded mode-locked laser.
Figure 8B:
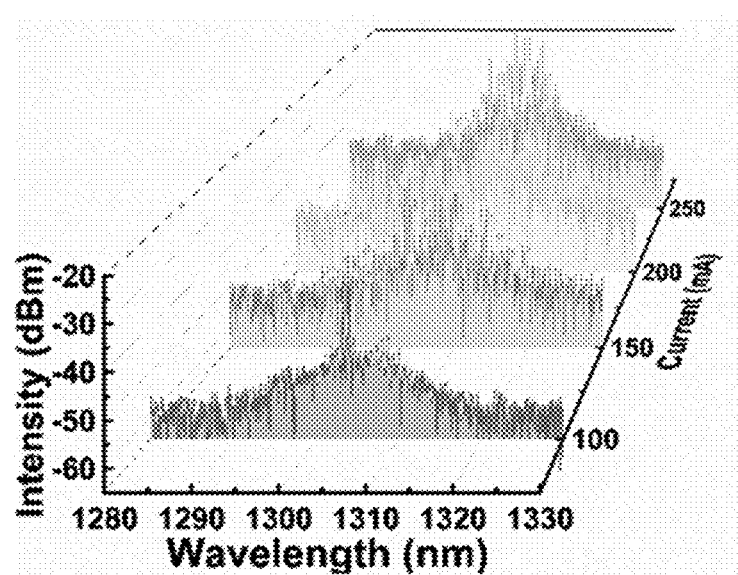
FIG. 8(B) illustrates electroluminescence (EL) current evolution spectrums of bonded mode-locked laser.

The DC characteristics of bonded QD-MLLs are tested with current injection ($I_g$) and a constant reverse bias voltage ($V_a$) applied to the saturable absorber section. The devices are mounted on an aluminum oxide submount using Indium-Tin solder (Indium Corporation ribbonin-10809) on top of a thermoelectric cooler (TEC) to maintain room temperature (RT) operation during measurement. The continue wave (CW) light-current (L-I) characteristics of bonded QDMLLs with forward and backward sweeping of the injection current under zero bias (0 V) and 4 V and 7V reverse bias conditions are shown FIG. 8. FIG. 8A shows light current (L-I) characteristics of the bonded mode-locked laser under reverse bias voltages of 0V, −4V and −7V with forward and backward sweep current. FIG. 8A inset shows electroluminescence (EL) of bonded mode-locked laser with a reverse bias voltage of 0V with injection current of 150 mA and FIG. 8B shows electroluminescence (EL) current evolution spectrums of bonded mode-locked laser with injection current from 100 mA to 250 mA without bias voltage.

Figure 9A:
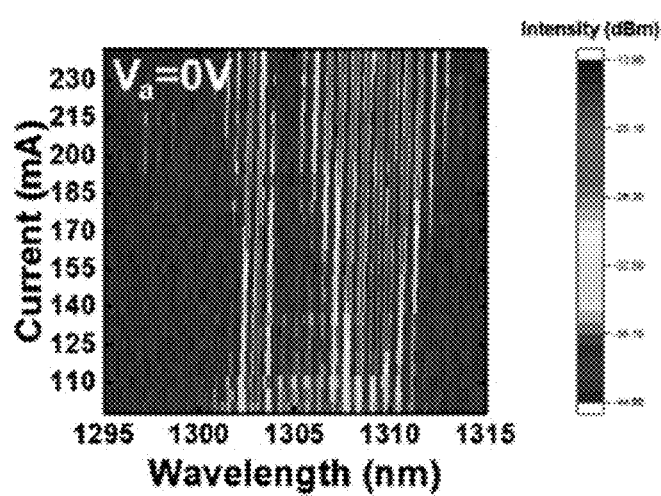
FIG. 9A shows optical and FIG. 9B RF spectra evolutions with injection current from 100 mA to 240 mA at 0V bias and FIG. 9C shows optical and FIG. 9D RF spectra evolutions with injection current from 100 mA to 240 mA at −7V bias, with inset: RF spectra at optimized injection ($I_g$=125 mA) and at bifurcated spectrum operation ($I_g$=215 mA)
Figure 9B:
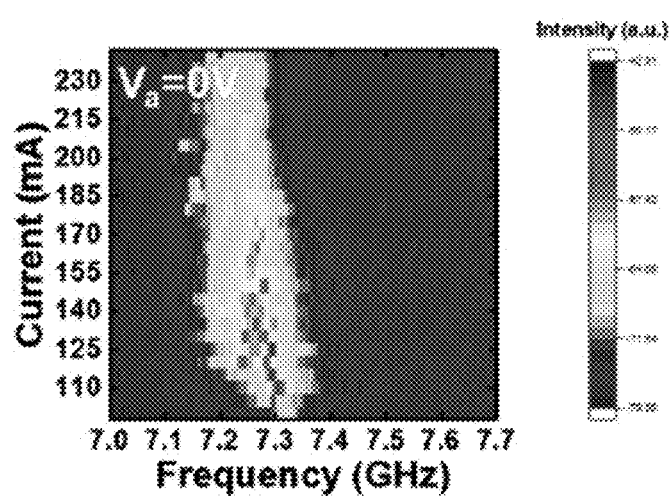
Figure 9C:
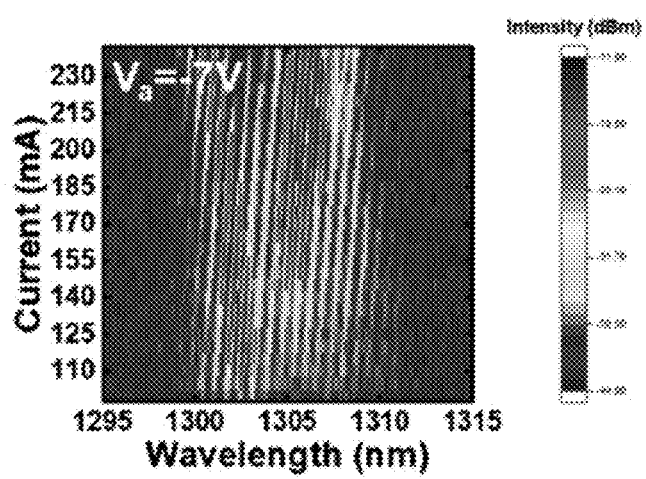
Figure 9D:
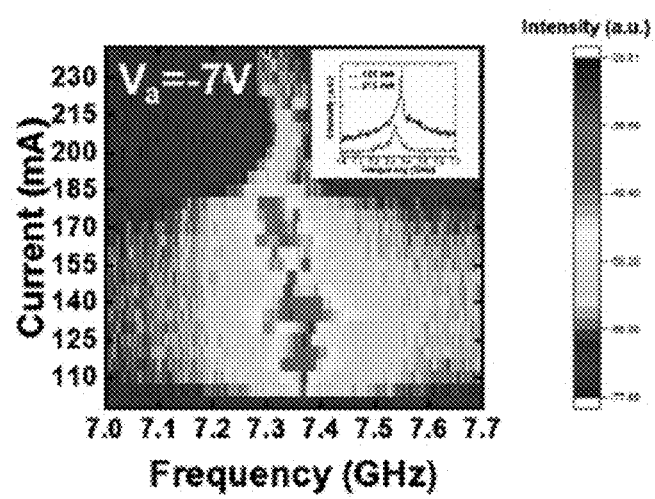

When the absorber is short circuited ($V_a$=0V), the QD-MLL shows a threshold current ($I_{th}$) of 94 mA, and a single facet output power of ~20 mW at an injection current of 240 mA. At a reverse bias of $V_a$=−7V, the threshold current is increased to 100 mA due to the higher cavity losses generated from the reverse-biased saturable absorber. We note that a bistability effect around threshold current region is not obvious due the high ratio of gain/absorber section FIG. 9A shows optical and FIG. 9B shows RF spectra evolutions with injection current from 100 mA to 240 mA at 0V bias and FIG. 9C shows optical and FIG. 9D RF spectra evolutions with injection current from 100 mA to 240 mA at −7V bias, with inset: RF spectra at optimized injection ($I_g$=125 mA) and at bifurcated spectrum operation ($I_g$=215 mA); The RF signal degrades significantly at higher injection currents where the optical spectrum splits.

The RF properties are characterized using a high-index single-mode fiber (Nufern UHNA) directly coupled from the saturable absorber facet. The coupled light is then sent through an O-band semiconductor optical amplifier (SOA) (Thorlabs S9FC1132P) to boost the power intensity and is followed by an optical splitter for simultaneous characterization of the RF spectrum, optical spectrum, pulse train, and pulse width. In order to characterize the mode-locking dynamics of the bonded QD-MLL, optical and RF spectra 2D evolutions are generated from the OSA (optical spectrum analyzer) and RF spectrum analyzer measurements simultaneously. These 2D optical and RF spectra evolutions are characterized over reverse bias voltages from 0 V to −7 V with −1 V steps. FIG. 9 shows the evolution of the optical and RF spectra at reverse biases of −7V and 0V, respectively, which are selected to indicate the typical differences of bonded MLLs functioning at the two ends of the bias conditions. The RF spectra exhibits mode-locking under high or low reverse bias conditions; however, higher reverse bias voltages result in locking over a wider range of conditions as well as a stronger RF signal due to the faster absorption recovery in the saturable absorber. It is worth noting that the laser operates at a higher RF frequency at higher reverse bias conditions since the elevated bias voltage induces more loss, essentially shortening the cavity length of the laser. In addition, under both reverse bias conditions, the bonded MLL shows a stable narrow RF spectrum around the threshold current, and the linewidth broadens as the optical spectrum transitions from single to dual band with increased injection current. This dual band phenomenon was also observed in unbonded QD mode-locked lasers, the band splitting may be due to internal optical power, AC stark effect or the pumping effects from coupled groups of QDs. The gap between dual spectral bands results in refractive index differences, leading to two competing groups of pulses in the cavity, which destabilizes operation. Optimum mode-locking conditions are achieved under high reverse bias with an injection current set below the bifurcation of the optical spectrum. This set of conditions usually occurs around the threshold current ($V_a$=−7 V and $I_g$=124 mA).

Under these optimized MLL conditions we have characterized the temporal and spectral characteristics of the laser. In the FIG. 10A inset, a pulse train is observed by using a digital sampling oscilloscope with an optical detection module and triggered with an amplified RF signal. The pulse period is approximately 136 ps, in agreement with the 7.3 GHz RF spectrum shown in FIG. 10A, and corresponding to the fundamental cavity repetition rate. The side peaks and broadened pulse width observed in each pulse are due to the non-ideal response of the photodetector. In order to measure the actual pulse width, the SOA amplified pulse train is sent into a Femtochrome autocorrelator (FR-130HS). FIG. 10B inset shows the autocorrelation trace with a Full-Width-Half-Maximum (FWHM) of 2.96 ps, which corresponds to a deconvolved 1.9 ps pulse using a $sech^2$ fitting. The corresponding optical spectrum is measured to have a FWHM of 0.97 nm [~172 GHz] (FIG. 10B). The resulting time-bandwidth product is 0.326 which is comparable to the $sech^2$ shape Fourier transfer limited theoretical value of 0.315, i.e., 1.029× the transform limit or within 5% of our experimental value. The asymmetric pulse shape is attributed to gain clipping in the SOA, or chirp effects inside the bonded MLL.

In conclusion, we have demonstrated nearly transform limited quantum dot mode-locked lasers on silicon by low temperature Pd—GaAs wafer bonding technology. The optimized modelocked lasers operate near 1.3 μm wavelength with a 7.3 GHz repetition rate and about a 2 ps pulse width. In addition, mode-locking was investigated over a wide range of operating conditions by adjusting gain injection currents and reverse bias voltages of the saturable absorber. These hybrid InAs QD MLLs are a promising solution to integrating laser sources together with silicon photonic integrated circuits (PICs).

Figure 10A:
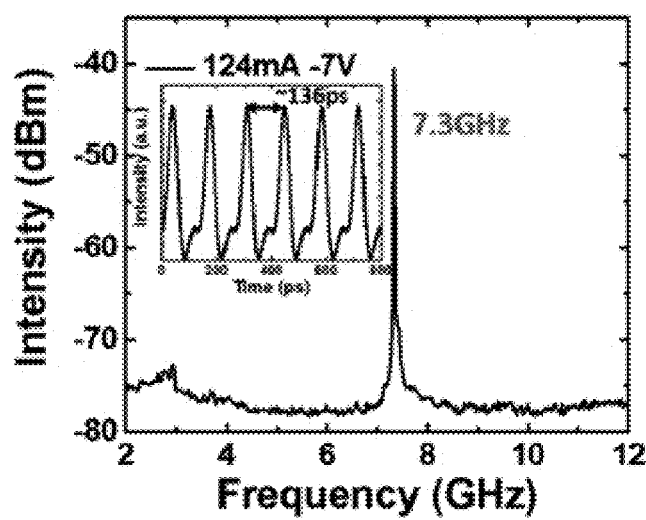
FIG. 10A shows RF spectrum and pulse train (inset), FIG. 10B optical spectrum and temporal pulse width (inset) of bonded mode-locked QD laser under the optimized bias condition of $I_g$=124 mA and $V_a$=−7 V, respectively.
Figure 10B:
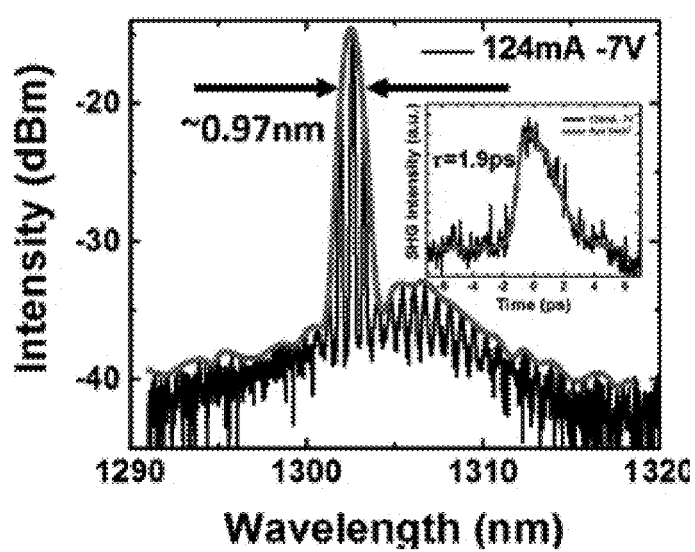

The RF spectrum of FIG. 10A, pulse train (FIG. 10A inset), pulse width (FIG. 10B), optical spectrum (FIG. 10B inset) of bonded mode-locked QD laser under the optimum bias condition of $I_g$=124 mA and $V_a$=−7V, respectively.

In FIG. 10A inset, a pulse train is observed by using a digital sampling oscilloscope with an optical detection module and triggered with an electric amplified RF signal from a 10 GHz photodetector. The pulse period is around 136 ps which is in agreement with the 7.3 GHz RF spectrum shown in FIG. 10A. The side peak observed in each pulse is due to the non-ideal response of the photodetector. In order to measure the actual pulse width, the BOA amplified pulse signal is sent into a commercial Femtochrome autocorrelator (FR-130HS). FIG. 10B shows the autocorrelation trace of 2.96 ps FWHM, which corresponds to 1.9 ps considered as a $sech^2$ pulse. The optical spectrum associated with this pulse shown in inset of FIG. 10B indicates an FHWM of 0.97 nm which corresponds to a frequency bandwidth of ~172 GHz. Then the time-bandwidth product can be calculated as 0.326 which is comparable to the sech$^2$ shape Fourier transfer limit theoretical value of 0.315, i.e., within 5% of our experimental value. The asymmetric pulse shape may be due to the parallel injection from BOA which leads to the asymmetry gain. It may also be due to the chirp effects inside bonded MLL.

Although various embodiments have been depicted and described in detail herein, it will be apparent to those skilled in the relevant art that various modifications, additions, substitutions, and the like can be made without departing from the spirit of the disclosure and these are therefore considered to be within the scope of the disclosure as defined in the claims which follow.

What is claimed:

1. A method for fabricating a mode-locked laser on a silicon substrate comprising:
    coating a palladium bonding layer on a silicon substrate;
    bonding a mode-locked laser comprising an etch stop layer and compound semiconductor substrate to the palladium layer by a low temperature metal-mediated bonding technique;
    removing the compound semiconductor substrate;
    removing the etch stop layer; and
    fabricating the mode-locked laser on the silicon substrate.

2. A mode-locked laser on a silicon substrate comprising:
    a mode-locked laser bonded to a palladium bonding layer and a silicon substrate bonded to the palladium bonding layer.

3. The mode-locked laser according to claim 2, having:
    a p-type GaAs layer bonded to the silicon substrate by the palladium bonding layer;
    a p-type doped $Al_{0.35}Ga_{0.65}As$ cladding adjacent the p-type GaAs layer;
    10 stacks of InAsQD layers adjacent the p-type doped $Al_{0.35}Ga_{0.65}$ cladding;
    n-type $Al_{0.35}Ga_{0.65}As$ cladding adjacent the 10 stacks of InAsQD layers; and
    an n-type GaAs layer adjacent the n-type $Al_{0.35}Ga_{0.65}As$ cladding.

4. The mode-locked laser according to claim 2, wherein the mode-locked laser is an electrically pumped InAs quantum dot two-section passively mode-locked laser on a silicon substrate having Pd—GaAs wafer bonding operating at 1.3 μm which generates pulses at a repetition rate of ~7 GHz and pulse width of 2 ps.

5. The mode-locked laser according to claim 2, wherein the mode-locked laser comprises a hybrid InAs QD MLL on the silicon substrate, which has ultrafast, high repetition rate, low-jitter, temperature insensitive properties.

6. The mode-locked laser according to claim 5, further comprising integrating the laser source together with silicon photonic OTDM and WDM optical integrate circuits (OICs) on silicon.

7. The mode-locked laser according to claim 2, wherein the mode-locked laser comprises a QD MLL that is configured in colliding pulse mode-locked (CPM) configuration.

8. The mode-locked laser according to claim 2, wherein the mode-locked laser comprises a QD MLL that is configured in single cavity mode locked configuration.

9. The mode-locked laser according to claim 2, wherein the mode-locked laser comprises a InAs MLL on Si by Pd—GaAs wafer bonding technology that is applied to heterogeneous integration of the QD lasers/gain chip with silicon photonics integrated circuits (PICs) by using a butt-joint coupling configuration.

10. The mode-locked laser according to claim 2, which comprises an optical interconnect to a telecommunications device.

* * * * *